United States Patent
Chai et al.

(10) Patent No.: US 10,756,142 B2
(45) Date of Patent: Aug. 25, 2020

(54) DISPLAY PANEL AND DISPLAY DEVICE

(71) Applicant: Shanghai Tianma AM-OLED Co., Ltd., Shanghai (CN)

(72) Inventors: Huiping Chai, Shanghai (CN); Lijing Han, Shanghai (CN)

(73) Assignee: Shanghai Tianma AM-OLED Co., Ltd., Shanghai (CN)

( * ) Notice: Subject to any disclaimer, the term of this patent is extended or adjusted under 35 U.S.C. 154(b) by 0 days.

(21) Appl. No.: 16/458,201

(22) Filed: Jul. 1, 2019

(65) Prior Publication Data

US 2019/0326364 A1 Oct. 24, 2019

(30) Foreign Application Priority Data

Dec. 29, 2018 (CN) .......................... 2018 1 1643686

(51) Int. Cl.
*H01L 27/32* (2006.01)

(52) U.S. Cl.
CPC ...... *H01L 27/3216* (2013.01); *H01L 27/3276* (2013.01); *H01L 27/3288* (2013.01)

(58) Field of Classification Search
CPC ............. H01L 27/3216; H01L 27/3276; H01L 27/3288
USPC ....................................................... 257/773
See application file for complete search history.

(56) References Cited

U.S. PATENT DOCUMENTS

2018/0219058 A1* 8/2018 Xiang ................. H01L 27/3276

FOREIGN PATENT DOCUMENTS

| CN | 107633802 A | 1/2018 |
| CN | 108257514 A | 7/2018 |

* cited by examiner

*Primary Examiner* — Tong-Ho Kim
(74) *Attorney, Agent, or Firm* — Kilpatrick Townsend & Stockton, LLP

(57) ABSTRACT

Provided is a display panel and display device. The display panel includes a first non-display area, a first display area, a second display area and a third display area. The first display area at least partially surrounds the first non-display area, the first display area and the second display area are arranged in a first direction, the third display area is arranged with the first and second display areas in a second direction. The first display area includes first sub-pixels arranged in array, the second display area includes second sub-pixels arranged in array, and the third display area includes third sub-pixels arranged in array. Each first sub-pixel, each second sub-pixel and each third sub-pixel have a same size in the first direction; each first sub-pixel and each second sub-pixel have a same size in the second direction and each second sub-pixel has the size greater than each third sub-pixel in the second direction.

15 Claims, 9 Drawing Sheets

DISPLAY PANEL AND DISPLAY DEVICE

CROSS-REFERENCE TO RELATED APPLICATIONS

This application claims priority to Chinese patent application No. 201811643686.0 filed with the Patent Office of the People's Republic of China on Dec. 29, 2018, the disclosure of which is incorporated herein by reference in its entirety.

FIELD

The present disclosure relates to a display technology and, in particular, to a display panel and a display device.

BACKGROUND

At present, the full-screen almost occupies a large proportion of the consumer goods market, and the full-screen on the market essentially is a screen with a very high screen-to-body ratio. Therefore, a hot developing direction for the current display screen is to further improve the screen-to-body ratio of the full screen also becomes. On this basis, the full-screen hole-punch technology (including actual hole digging and transparent blind hole technology) comes into being. The full-screen adopting the hole-punch design not only can meet a requirement of the high screen-to-body ratio, but also can cooperate well with the camera and other accessories.

A functional device such as a camera may be placed at the punch position on the display screen adopting the hole-punch design. To meet the requirements on the display effects, in some display screens, the resolution and pixel arrangement may be different in a display area near the hole-punch and in a display area outside the display area near the hole-punch. However, the mismatching between pixels in the display area near the hole-punch and pixels in the display area outside the display area near the hole-punch leads to the existence of a residual space.

SUMMARY

Embodiments of the present disclosure provide a display panel and a display device to avoid a residual space caused by mismatching between the pixels in the display area near the hole-punch and pixels in the display area outside the display area near the hole-punch in the existing hole-punch display screen.

An embodiment of the present disclosure provides a display panel.

The display panel includes a first non-display area, a first display area, a second display area and a third display area. The first display area at least partially surrounds the first non-display area, the first display area and the second display area are arranged in a first direction, the third display area is arranged with the first display area and the second display area in a second direction respectively, the first direction is perpendicular to the second direction.

The first display area includes multiple first sub-pixels arranged in array, the second display area includes multiple second sub-pixels arranged in array, the third display area multiple third sub-pixels arranged in array. Each first sub-pixel, each second sub-pixel and each third sub-pixel have a same size in the first direction; each first sub-pixel and each second sub-pixel have a same size in the second direction and each second sub-pixel has the size greater than each third sub-pixel in the second direction.

An embodiment of the present disclosure provides a display device including the above-mentioned display panel.

In embodiments of the present disclosure, a first display area and a second display area are arranged in a first direction. A third display area is arranged with the first display area and the second display area in a second direction respectively. Each first sub-pixel, each second sub-pixel and each third sub-pixel have a same size in the first direction; each first sub-pixel and each second sub-pixel have a same size in the second direction and each second sub-pixel has the size greater than each third sub-pixel in the second direction. In an embodiment of the present disclosure, the display panel is a full-screen adopting the transparent hole-punch design. Pixels arranged in a manner of matching different pixel size and different pixel resolution in the periphery of the first non-display area and other display areas, so that no residual space exists, and on basis of ensuring normal display of the screen, high resolution display is implemented in the second display area and the third display area. This improves the quality of the display picture and further ensures an excellent display quality of the fingerprint recognition area of the third display area. Moreover, effects that pixels in the first display area and the second display area matched with the pixels in the third display area as well as the pixels in the first display area matched with the pixels in the second display area are implemented, the residual space caused by the mismatching of the pixels in different display areas in the existing hole-punch display screen is avoided, the size and arrangement of the pixels in different display area are optimized, the space is rationally used and the display quality is improved.

BRIEF DESCRIPTION OF DRAWINGS

To illustrate the present disclosure or in the related art more clearly, drawings used in description of the embodiments or the related art will be briefly described below. Apparently, the drawings described below illustrate only part of the embodiments of the present disclosure.

DETAILED DESCRIPTION

The present disclosure will be described clearly and completely with reference to the accompanying drawings through embodiments. Apparently, the embodiments described below are part, not all, of embodiments of the present disclosure.

Figure 1:
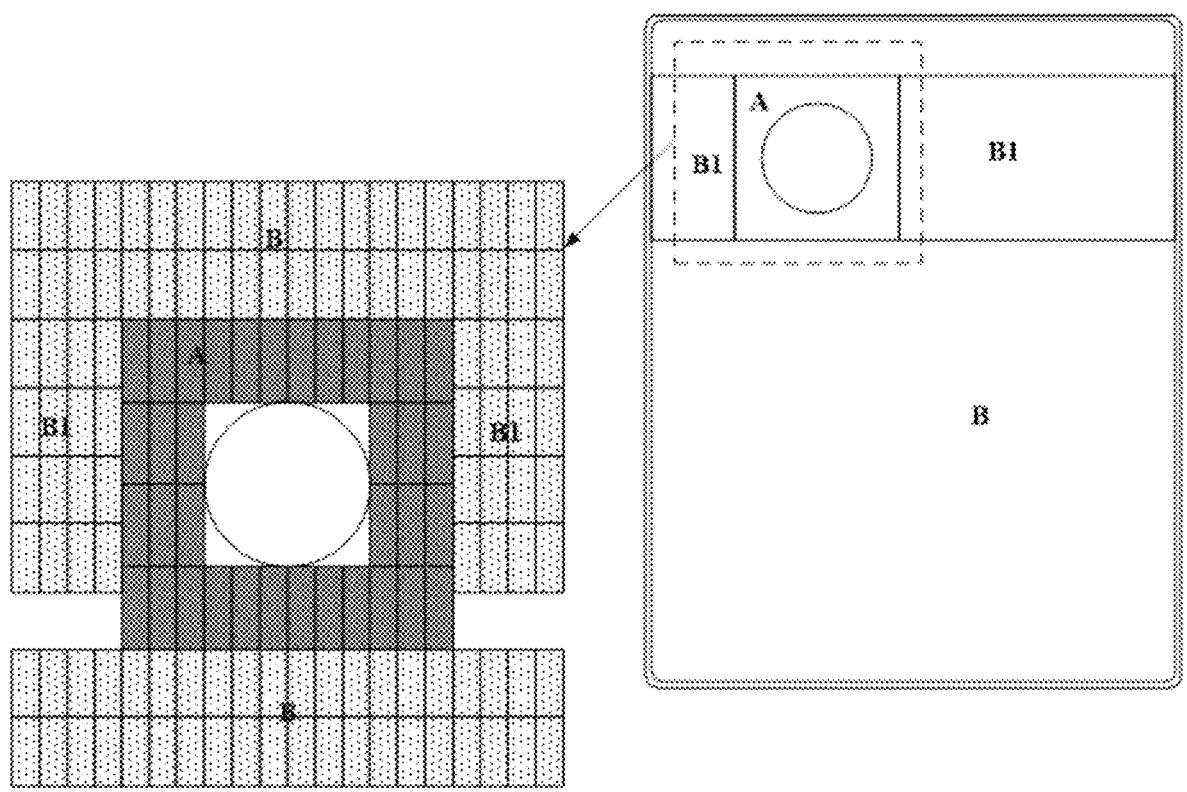
FIG. 1 is a schematic diagram of a display panel in the related art.

A functional device such as a camera may be placed at the punch position on the display screen adopting the hole-punch design. As shown in FIG. 1, for the existing display screen adopting the transparent hole-punch design, to meet the demands of the display effects, some display screens require different resolutions and pixel arrangements in a display area A near the hole-punch and a display area B (including B1) outside the display area near the hole-punch. Pixels of the display area A are arranged in a Real arrangement, and pixels of the display area B are arranged in a sub-pixel rendering (SPR) arrangement. In general, for the display screen with the same size of the display area, a resolution SPR PPI in the SPR arrangement is greater than a resolution Real PPI in the Real arrangement.

Figure 2:
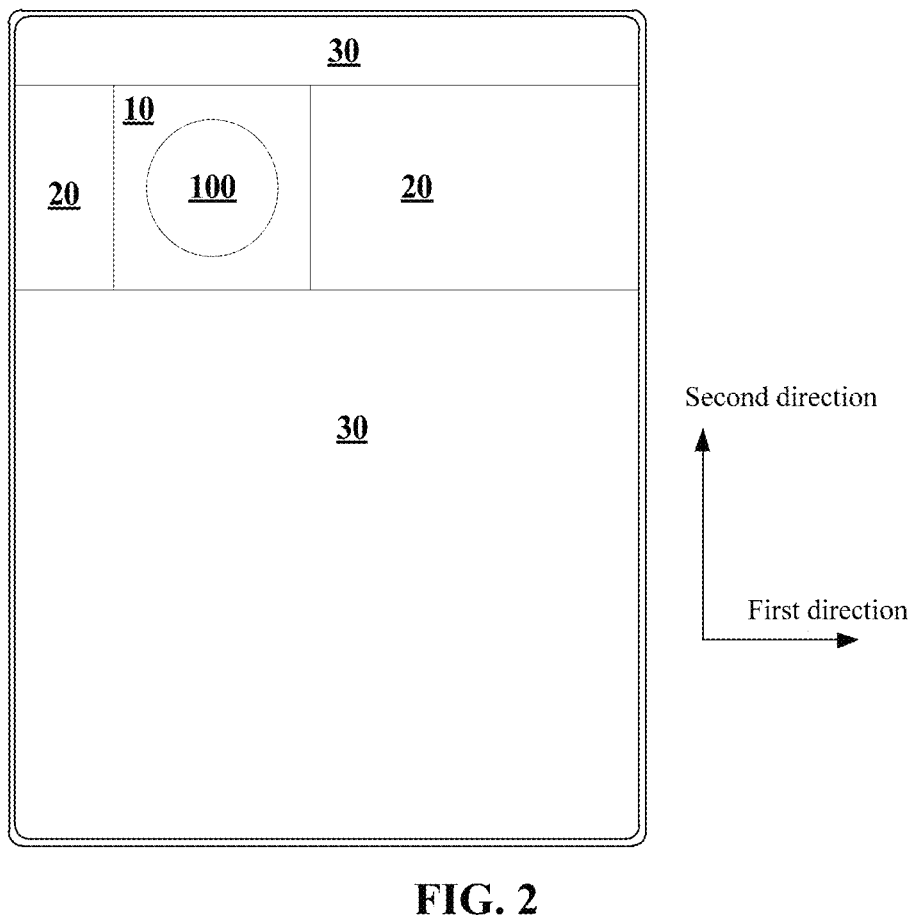
FIG. 2 is a schematic diagram of a display panel according to an embodiment of the present disclosure.
Figure 3:
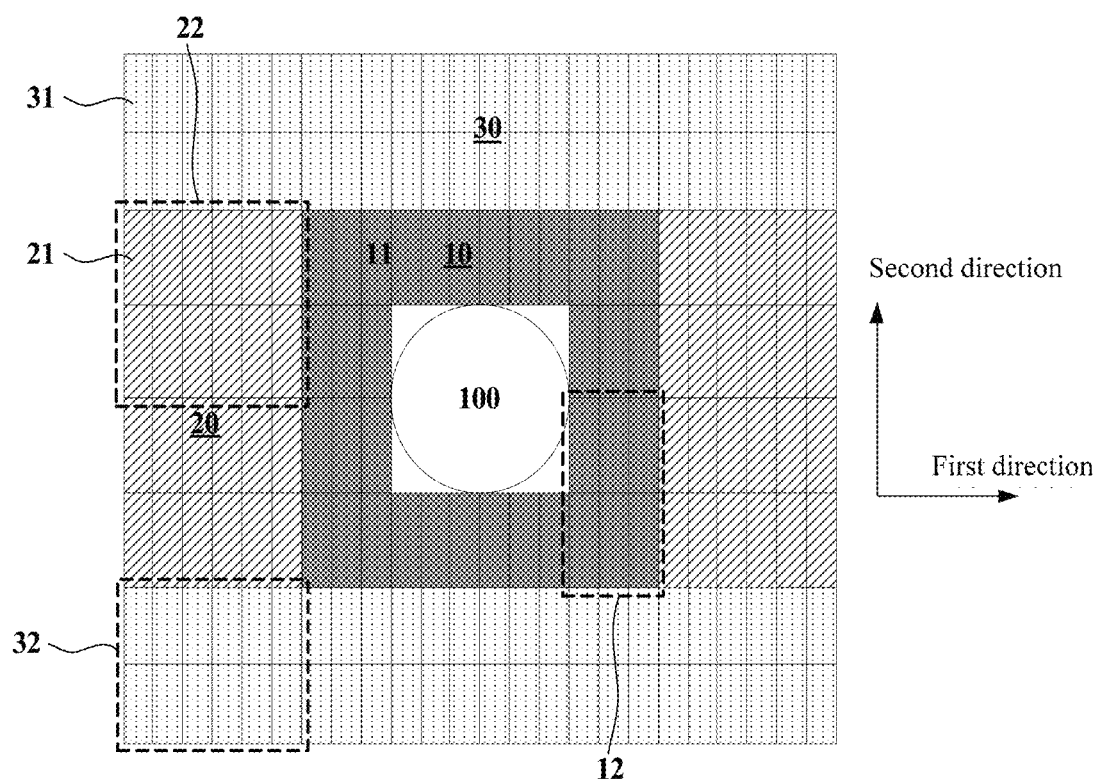
FIG. 3 is a partial enlarged schematic diagram of FIG. 2.

FIG. 2 is a schematic diagram of a display panel according to an embodiment of the present disclosure. FIG. 3 is a partial enlarged schematic diagram of FIG. 2. The display panel provided by this embodiment includes a first non-display area 100, a first display area 10, a second display area 20 and a third display area 30. The first display area 10 at least partially surrounds the first non-display area 100. The first display area 10 and the second display area 20 are arranged in a first direction. The third display area 30 is arranged with the first display area 10 and the second display area 20 in a second direction respectively. The first direction is perpendicular to the second direction. The first display area 10 includes multiple first sub-pixels 11 arranged in array. The second display area 20 includes multiple second sub-pixels 21 arranged in array. The third display area 30 includes multiple third sub-pixels 31 arranged in array. Each first sub-pixel 11, each second sub-pixel 21 and each third sub-pixel 31 have a same size in the first direction. Each first sub-pixel 11 and each second sub-pixel 21 have a same size in the second direction and each second sub-pixel 21 has the size greater than each third sub-pixel 31 in the second direction.

In this embodiment, the display panel may be an organic light emitting display panel. In some embodiments, the display panel includes, but is not limited to, the organic light emitting display panel, and any type of display panel adopting the hole-punch technology is within the scope of the present disclosure.

In this embodiment, the display panel includes multiple sub-pixels which are arranged in array. Correspondingly, sub-pixels in each display area are arranged in array. The first non-display area 100 includes a hole digging area. The first display area 10 at least partially surrounds the first non-display area 100, and the first direction may be a row direction. The first display area 10 and the second display area 20 are arranged in the row direction; correspondingly, the number of pixel rows of the first display area 10 is the same with the number of pixel rows of the second display area 20. The second direction may be a column direction. The third display area 30 is arranged with the first display area 10 and the second display area 20 in a second direction respectively. The first direction is perpendicular to the second direction. As shown in FIG. 2, the first display area 10 may totally surround the first non-display area 100. A case where the first display area 10 partially surrounds the first non-display area 100 also exists in the display panel (as shown in the subsequent drawings FIGS. 4 and 5). When the first display area partially surrounds the first non-display area, the first display area may be located on a left side, a right side, an upper side or a lower side of the first non-display area, and the first display area may be located on the left side, the right side and the lower side of the first non-display area.

In this embodiment, the pixel design may be different for different display areas. The first display area 10 includes the multiple first sub-pixels 11 arranged in array. The second display area 20 includes the multiple second sub-pixels 21 arranged in array. The third display area 30 includes the multiple third sub-pixels 31 arranged in array. Each first sub-pixel 11, each second sub-pixel 21 and each third sub-pixel 31 have a same size in the first direction, i.e., each sub-pixel has a same width in the row direction in the display panel, then sub-pixel rows of the first display area 10, and sub-pixel columns of the second display area 20 may have a same width and match with sub-pixel columns of the third display area 30. Each first sub-pixel 11 and each second sub-pixel 21 have a same size in the second direction, i.e., each sub-pixel has a same height in the first display area 10 and the second display area 20 in the column direction, then sub-pixels rows of the second display area 20 may have a same height and match with sub-pixels rows of the first display area 10. Apparently, each first sub-pixel 11 in the first display area 10 and each second sub-pixel 21 in the second display area 20 have the same size in the row and column directions. Each third sub-pixel 31 in the third display area 30 and each second sub-pixel 21 in the second display area 20 have the same size in the row direction. Correspondingly, no residual space exists in the first display area 10 and the second display area 20 which are disposed adjacently after the pixel arrangement, no residual space exists in the second display area 20 and the third display area 30 which are disposed adjacently after the pixel arrangement, and no residual space exists in the first display area 10 and the third display area 30 which are disposed adjacently after the pixel arrangement.

In this embodiment, each first sub-pixel 11, each second sub-pixel 21 and each third sub-pixel 31 have the same size in the first direction. Each first sub-pixel 11 and each second sub-pixel 21 have a same size in the second direction and each second sub-pixel 21 has the size greater than each third sub-pixel 31 in the second direction. Thus, the third display area 30 has a greater pixel resolution than the second display area 20 and the first display area 10.

In an embodiment, the size of each third sub-pixel 31 is $2/3$ of the size of each second sub-pixel 21 in the second direction. Each first sub-pixel 11 and each second sub-pixel 21 have a same size in the second direction. In one embodiment, the size of each third sub-pixel 31 is $2/3$ of the size of each second sub-pixel 21, so that the third display area 30 has the greater resolution than the first display area 10. In one embodiment, the display area is configured to include sub-pixels of three colors. Two adjacent third sub-pixels 31 in the third display area 30 constitute a third pixel lightspot, and three adjacent first sub-pixels 11 in the first display 10 constitute a first pixel lightspot. It is known that each first sub-pixel 11 and each third sub-pixel 31 have the same size in the first direction, then the size of the third pixel lightspot is $2/3$ of the size of the first pixel lightspot in the first direction, and the pixel lightspot has the same size in the row and column directions. On this basis, the size of the third pixel lightspot is $2/3$ of the size of the first pixel lightspot in the second direction; accordingly, the size of the third sub-pixel 31 is set to be $2/3$ of the size of the first sub-pixel 11 in the second direction, which may ensure that the third display area 30 has the greater resolution than the first display area 10.

In an embodiment, the first display area 10, the second display area 20 and the third display area 30 each includes sub-pixels of at least three colors. In an embodiment, at least three colors of the sub-pixels are red R, green G and blue B. In other embodiments, at least three colors of the sub-pixels may be red R, green G, blue B and white W, or red R, green G, blue B and yellow Y.

In an embodiment, the first display area 10 includes multiple first pixel repetition units 12 arranged in array. Each first pixel repetition unit 12 includes a number 3×2 of first sub-pixels 11. The second display area 20 includes multiple second pixel repetition units 22 arranged in array. Each second pixel repetition unit includes a number 6×2 of second sub-pixels 21. The third display area 30 includes multiple third pixel repetition units 32 arranged in array. Each third pixel repetition unit 32 includes a number 6×2 of third sub-pixels 31. In an embodiment, the display area includes sub-pixels of at least three colors. The pixel repetition unit in the display area is the minimum pixel repetition unit. The display area includes multiple pixel repetition units arranged in array. In some embodiments, when the sub-pixels have four colors, the number of the sub-pixels of the pixel repetition unit changes accordingly.

In an embodiment, in the second direction, the first display area 10 includes an even number of rows of the first sub-pixels 11, the second display area 20 includes an even number of rows of the second sub-pixels 21, and the third display area 30 includes an even number of rows of the third sub-pixels 31. In the first direction, the number of columns of the first sub-pixels 11 in the first display area 10, the number of columns of the second sub-pixels 21 in the second display area 20 and the number of columns of the third sub-pixels 31 in the third display area 30 each is a multiple of 6. In an embodiment, the display area includes the sub-pixels of three colors. Each first pixel repetition unit 12 includes the number 3×2 of the first sub-pixels 11. Each third pixel repetition unit 32 includes a number 6×2 of the third sub-pixels 31. The first display area 10, the second display area 20 and the third display area 30 each includes an even number of sub-pixel rows, the first display area 10 and the second display area 20 have the same even number of sub-pixel rows, and the number of sub-pixel columns in the first display area 10, the second display area 20 and the third display area 30 each is a multiple of 6.

Figure 4:
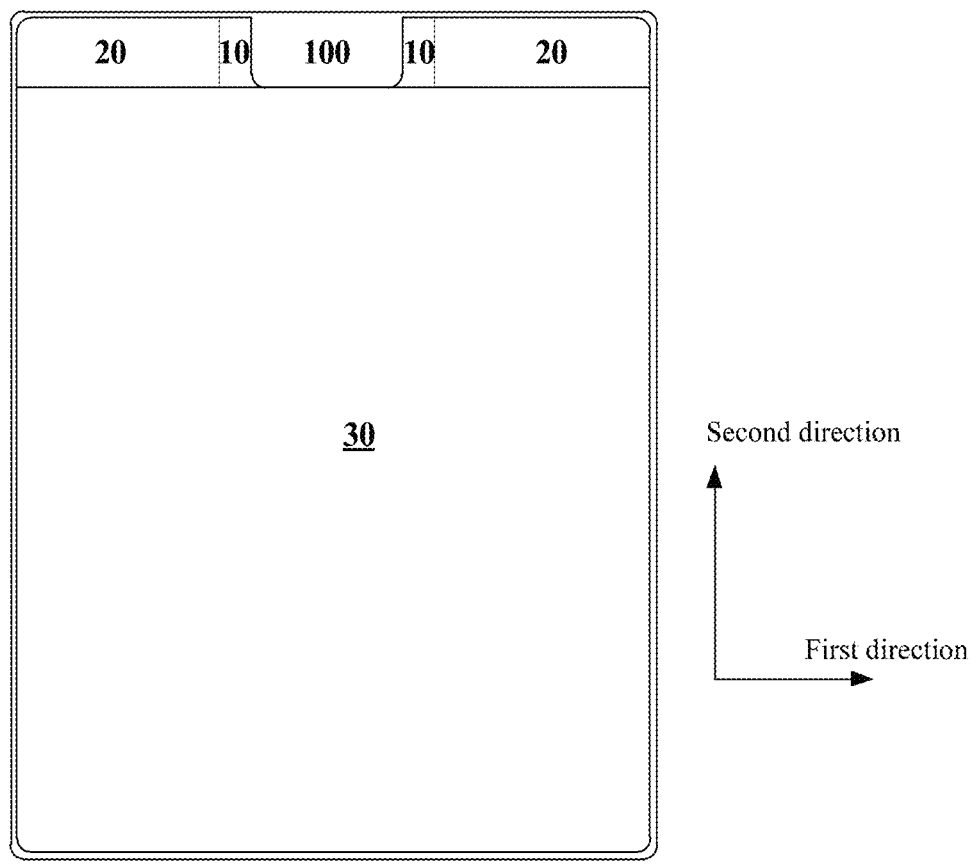
FIG. 4 is a schematic diagram of a display panel according to an embodiment of the present disclosure.
Figure 5:
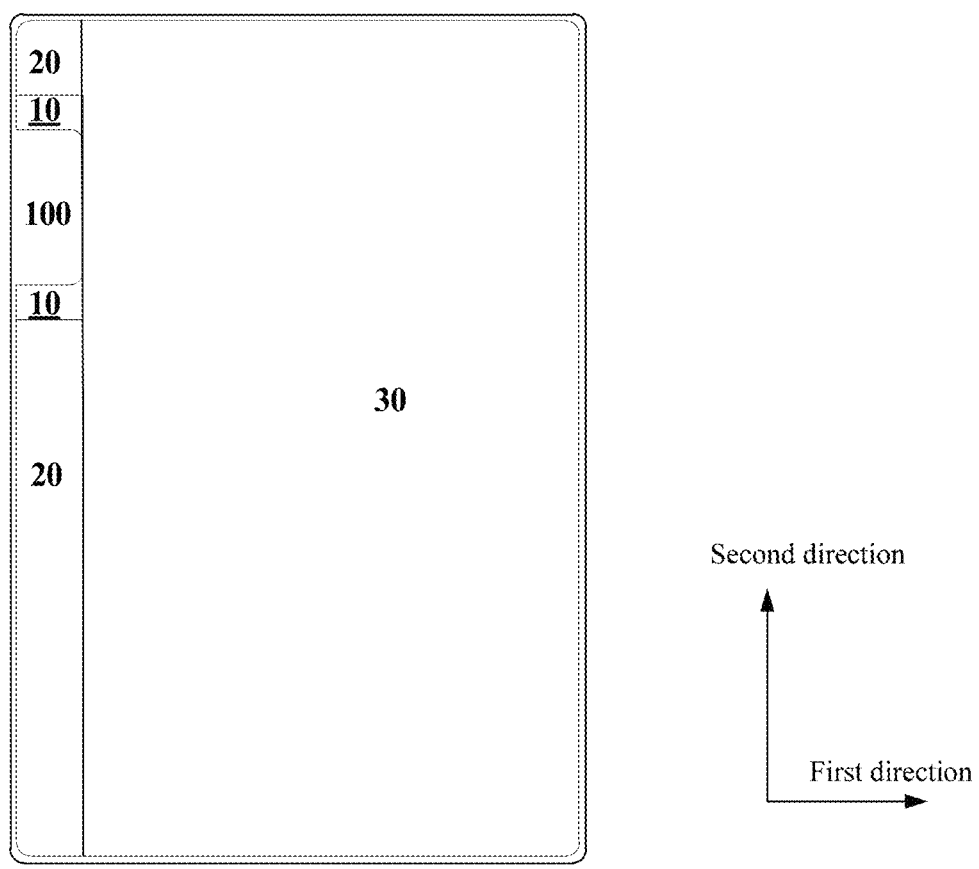
FIG. 5 is a schematic diagram of a display panel according to an embodiment of the present disclosure.

In an embodiment, the second display area 20 is disposed on two opposite sides of the first display area 10, the third display area 30 is disposed on two opposite sides of the first display area 10 and the second display area 20. The first non-display area 100 in the present disclosure may be located inside, at top edge, left edge or right edge of the display panel. According to the different position of the first non-display area 100, the second display area 20 may be located at two sides or one side of the first display area 10, and the third display area 30 may also be located at two sides or one side of the first display area 10. In one embodiment, as shown in FIG. 2, the first non-display area 100 is located inside the display panel, and the first display area 10 is also located inside the display panel, then the second display area 20 is located on the left side and the right sides of the second display area 20 and the third display area 30 is located on the upper side and the lower side of the first display area 10. In another embodiment, as shown in FIG. 4, the first non-display area 100 is located on the upper edge of the display panel, the first display area 10 is also located on the upper edge of the display panel, then the second display area 20 is located on the left side and the right sides of the first display area 10, and the third display area 30 is located on the lower side of the first display area 10. In another embodiment, as shown in FIG. 5, the first non-display area 100 is located on the left side of the display panel, the first display area 10 is also located on the left side of the display panel, then the second display area 20 is located on the upper side and the lower side of the first display area 10, and the third display area 30 is located on the right side of the first display area 10.

It is to be noted that the display panel provided in the embodiment of the present disclosure, a light-emitting opening areas of the sub-pixels of different display areas may be configured to have the same size, i.e., the mask opening areas of each first sub-pixel, each second sub-pixel and each third sub-pixel have the same size. Of course, the light-emitting opening areas of the sub-pixels of different display areas may be configured to different sizes. In some embodiments, configuration of the size of the light-emitting opening area of the sub-pixel in respective display area according to the needs for displaying products.

In addition, it is to be noted that, in the related art, based on the existence of the residual space, additional wiring space is required in transition from the display area B1 to the display area A or from the display area A to the display area B1. In the present disclosure, each first sub-pixel in the first display area and each second sub-pixel in the second display area in the display panel have the same size, then when the first display area and the second display area are arranged in the row direction, the scanning lines implement direct connection without occupying the additional wiring space when the scanning lines are transited from the first display area to the second display area or from the second display area to the first display area; and data lines implement direction connection without occupying the additional wiring space when the data lines are transited from the first/second display area to the third display area or from the third display area to the first/second display area. Similarly, when the first display area and the second display area are arranged in the column direction, the data lines and the scanning lines do not need to occupy the additional wiring space.

In this embodiment, the first display area and the second display area are arranged in the first direction, the third display area are arranged with the first display area and the second display area in the second direction respectively. Each first sub-pixel, each second sub-pixel and each third sub-pixel have the same size in the first direction, each first sub-pixel and each second sub-pixel have the same size in the second direction and each second sub-pixel has the size greater than each third sub-pixel. In an embodiment of the present disclosure, the display panel is a full-screen adopting the hole-punch design. Pixels arranged in a manner of matching different pixel size and different pixel resolution in the periphery of the first non-display area and other display areas, so that no residual space exists, and on the basis of ensuring normal display of the screen, high resolution display is implemented in the second display area and the third display area. This improves the quality of the display picture and further ensures an excellent display quality of the fingerprint recognition area of the third display area. Moreover, effects that pixels in the first display area and the second display area matched with the pixels in the third display area as well as the pixels in the first display area matched with the pixels in the second display area are implemented, the residual space caused by the mismatching of the pixels in different display areas in the existing hole-punch display screen is avoided, the size and arrangement of the pixels in different display area are optimized, the space is rationally used and the display quality is improved.

Figure 6:
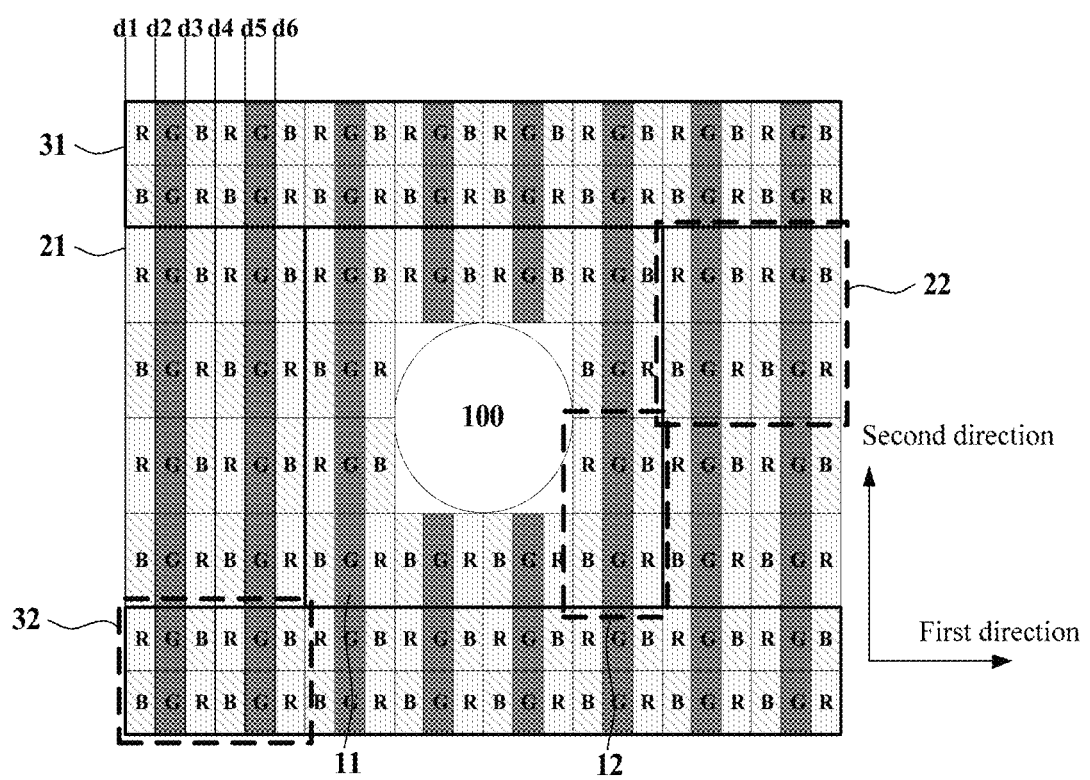
FIG. 6 is a schematic diagram of a pixel arrangement of a display panel according to an embodiment of the present disclosure.
Figure 7:
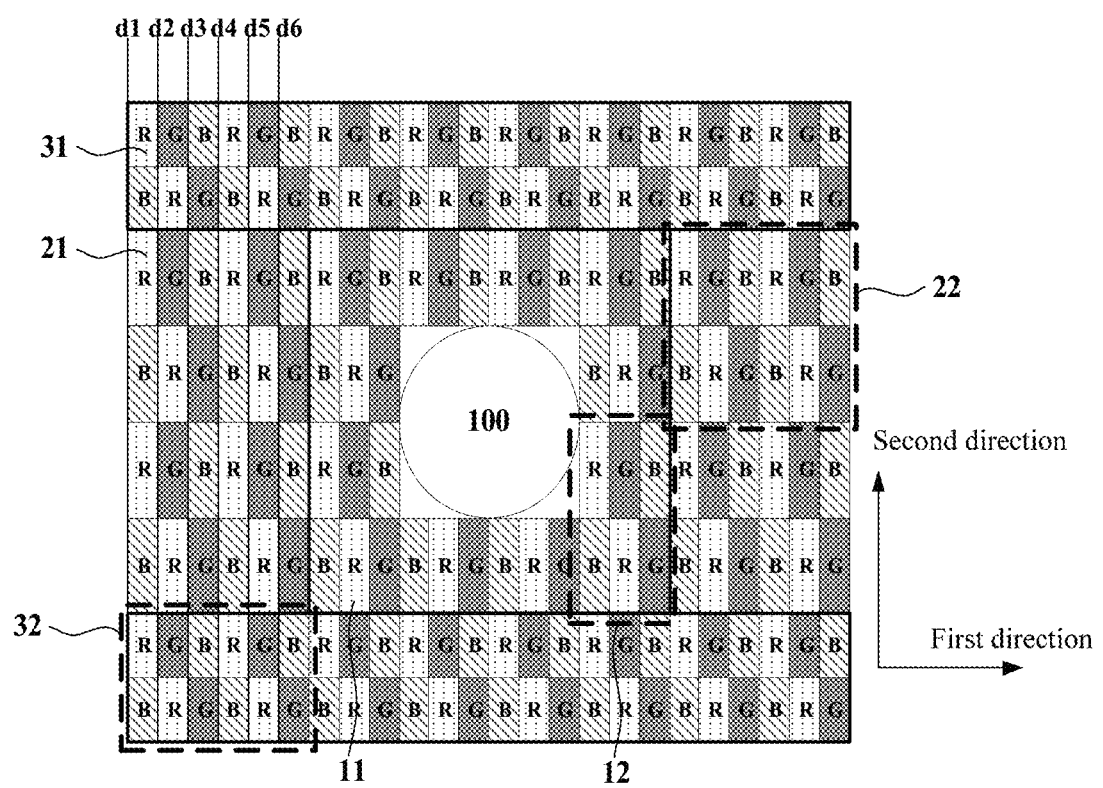
FIG. 7 is a schematic diagram of a pixel arrangement of a display panel according to an embodiment of the present disclosure.
Figure 8:
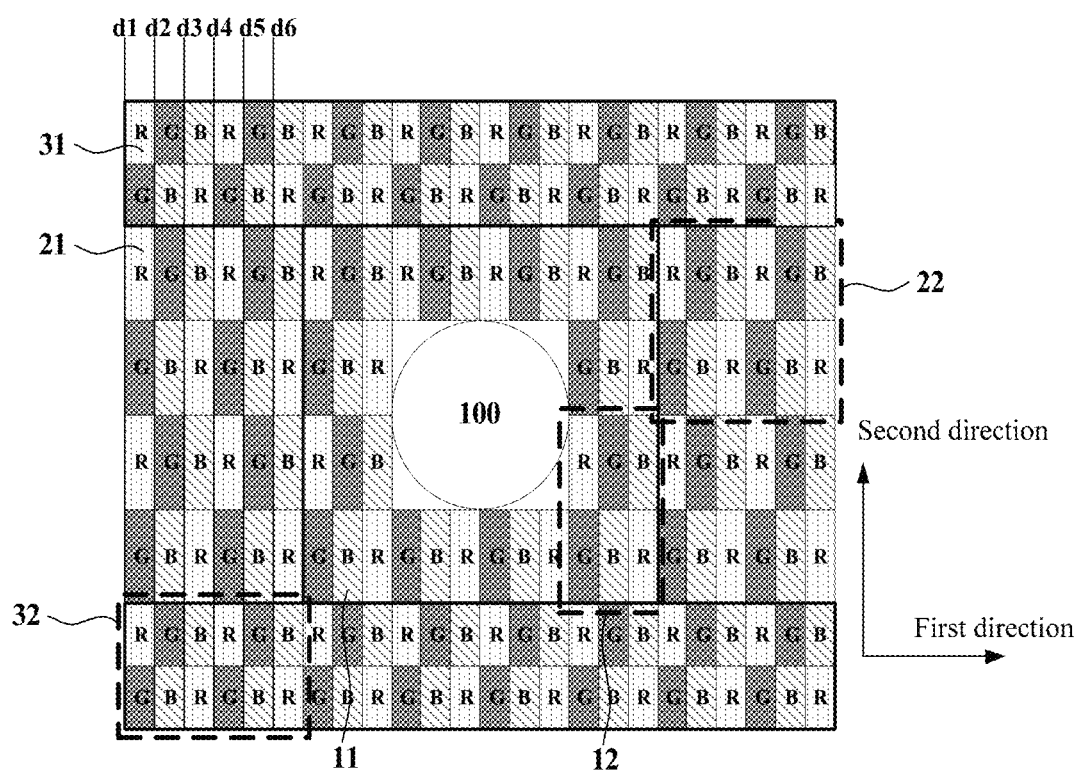
FIG. 8 is a schematic diagram of a pixel arrangement of a display panel according to an embodiment of the present disclosure.

Exemplarily, as shown in FIG. 6, the first sub-pixels 11 in a first row of each first pixel repetition unit 12 are arranged in an order of a first color, a second color and a third color; the first sub-pixels 11 in a second row of each first pixel repetition unit 12 are arranged in an order of the third color, the second color and the first color. The second sub-pixels 21 in a first row of each second pixel repetition unit 22 are arranged in an order of the first color, the second color, the third color, the first color, the second color and the third color; the second sub-pixels 21 in a second row of each second pixel repetition unit 22 are arranged in an order of the third color, the second color, the first color, the third color, the second color and the first color. The third sub-pixels 31 in a first row of each third pixel repetition unit 32 are arranged in the order of the first color, the second color, the third color, the first color, the second color and the third color; the third sub-pixels 31 in a second row of each third pixel repetition units 32 are arranged in the order of the third color, the second color, the first color, the third color, the second color and the first color. The first color, the second color and the third color are different.

In an embodiment, the first color is one color of red, green and blue, the second color is one color of red, green and blue, the third color is one color of red, green and blue. In an embodiment, the first display area 10, the second display area 20 and the third display area 30 each includes the sub-pixels of three colors. In an embodiment, the sub-pixels of three colors are red sub-pixels R, green sub-pixels G and blue sub-pixels B, then the first color, the second color and the third color each is one color of red, green and blue. In an embodiment, the first color, the second color and the third color are red, green and blue respectively. In other embodiments, the display area includes sub-pixels of four colors, which are a first color, a second color, a third color and a fourth color respectively. The four colors each is different from other colors and is one color of red, green, blue and yellow (white). In an embodiment, when the display area includes the sub-pixels of three colors, the first color, the second color and the third color are in other arrangement mode, the first color, the second color and the third color are green, red and blue respectively, which is not listed in the present disclosure.

In this embodiment, the first sub-pixels 11 in the first row of two adjacent first pixel repetition units 12 are arranged in a color order of RGBRGB, and the second row is BGRBGR. The second sub-pixels 21 in the first row of the second pixel repetition units 22 are arranged in a color order of RGBRGB, and the second row is BGRBGR. The third sub-pixels 31 in the first row of the third pixel repetition units 32 are arranged in a color order of RGBRGB, and the second row is BGRBGR. In an embodiment, the display panel further includes multiple data lines, which extend in the second direction and are arranged in the first direction, each data line is disposed corresponding to a column of the sub-pixels in the first direction and is electrically connected to the column of the sub-pixels. In this embodiment, for the whole display area, each two columns of the first pixel repetition units 12 or each column of the second pixel repetition units 22 or each column of the third pixel repetition units 32 corresponds to six data lines, which are respectively d1/d2/d3/d4/d5/d6. A color order of a column of sub-pixels corresponds to d1 is RBRB . . . RB, a color order of a column of sub-pixels corresponds to d2 is GGGG . . . GG, a color order of a column of sub-pixels corresponds to d3 is BRBR . . . BR, a color order of a column of sub-pixels corresponds to d4 is RBRB . . . RB, a color order of a column of sub-pixels corresponds to d5 is GGGG . . . GG, and a color order of a column of sub-pixels corresponds to d6 is BRBR . . . BR.

Exemplarily, in an embodiment, as shown in 7, the first sub-pixels 11 in a first row of each first pixel repetition unit 12 are arranged in an order of a first color, a second color and a third color; the first sub-pixels 11 in a second row of each first pixel repetition unit 12 are arranged in an order of the third color, the second color and the first color. The second sub-pixels 21 in a first row of each second pixel repetition unit 22 are arranged in an order of the first color, the second color, the third color, the first color, the second color and the third color; the second sub-pixels 21 in a second row of each second pixel repetition unit 22 are arranged in an order of the third color, the first color, the second color, the third color, the first color and the second color. The third sub-pixels 31 in a first row of each third pixel repetition unit 32 are arranged in the order of the first color, the second color, the third color, the first color, the second color and the third color; the third sub-pixels 31 in a second row of each third pixel repetition units 32 are arranged in the order of the third color, the first color, the second color, the third color, the first color and the second color. The first color, the second color and the third color are different.

In an embodiment, the first color is one color of red, green and blue, the second color is one color of red, green and blue, the third color is one color of red, green and blue. In an embodiment, the first display area 10, the second display area 20 and the third display area 30 each includes the sub-pixels of three colors. In an embodiment, the sub-pixels of three colors are red sub-pixels R, green sub-pixels G and blue sub-pixels B, then the first color, the second color and the third color each is one color of red, green and blue. In an embodiment, the first color, the second color and the third color are red, green and blue respectively. In other embodiments, the display area includes sub-pixels of four colors, which are a first color, a second color, a third color and a fourth color respectively. The four colors each is different from other colors and is one color of red, green, blue and yellow (white). In an embodiment, when the display area includes the sub-pixels of three colors, the first color, the second color and the third color are in other arrangement mode, the first color, the second color and the third color are green, red and blue respectively, which is not listed in the present disclosure.

In this embodiment, the first sub-pixels 11 in the first row of two adjacent first pixel repetition units 12 are arranged in a color order of RGBRGB, and the second row is BRGBRG. The second sub-pixels 21 in the first row of the second pixel repetition units 22 are arranged in a color order of RGBRGB, and the second row is BRGBRG. The third sub-pixels 31 in the first row of the third pixel repetition units 32 are arranged in a color order of RGBRGB, and the second row is BRGBRG. In an embodiment, the display panel further includes multiple data lines, which extend in the second direction and are arranged in the first direction, each data line is disposed corresponding to a column of the sub-pixels in the first direction and is electrically connected to the column of the sub-pixels. In this embodiment, for the whole display area, each two columns of the first pixel repetition units 12 or each column of the second pixel repetition units 22 or each column of the third pixel repetition units 32 corresponds to six data lines, which are respectively d1/d2/d3/d4/d5/d6. A color order of a column of sub-pixels corresponds to d1 is RBRB . . . RB, a color order of a column of sub-pixels corresponds to d2 is GRGR . . . GR, a color order of a column of sub-pixels corresponds to d3 is BGBG . . . BG, a color order of a column of sub-pixels corresponds to d4 is RBRB . . . RB, a color order of a column of sub-pixels corresponds to d5 is GRGR . . . GR and a color order of a column of sub-pixels corresponds to d6 is BGBG . . . BG.

Exemplarily, and in an embodiment, as shown in 8, the first sub-pixels 11 in a first row of each first pixel repetition unit 12 are arranged in an order of a first color, a second color and a third color; the first sub-pixels 11 in a second row of each first pixel repetition unit 12 are arranged in an order of the second color, the third color and the first color. The second sub-pixels 21 in a first row of each second pixel repetition unit 22 are arranged in an order of the first color, the second color, the third color, the first color, the second color and the third color; the second sub-pixels 21 in a second row of each second pixel repetition unit 22 are arranged in an order of the second color, the third color, the first color, the second color, the third color and the first color. The third sub-pixels 31 in a first row of each third pixel repetition unit 32 are arranged in the order of the first color, the second color, the third color, the first color, the second color and the third color; the third sub-pixels 31 in a second row of each third pixel repetition units 32 are arranged in the order of the second color, the third color, the first color, the second color, the third color and the first color. The first color, the second color and the third color are different.

In an embodiment, the first color is one color of red, green and blue, the second color is one color of red, green and blue, the third color is one color of red, green and blue. In an embodiment, the first display area 10, the second display area 20 and the third display area 30 each includes the sub-pixels of three colors. In an embodiment, the sub-pixels of three colors are red sub-pixels R, green sub-pixels G and blue sub-pixels B, then the first color, the second color and the third color each is one color of red, green and blue. In an embodiment, the first color, the second color and the third color are red, green and blue respectively. In other embodiments, the display area includes sub-pixels of four colors, which are a first color, a second color, a third color and a fourth color respectively. The four colors each is different from other colors and is one color of red, green, blue and yellow (white). In an embodiment, when the display area includes the sub-pixels of three colors, the first color, the second color and the third color are in other arrangement mode, the first color, the second color and the third color are green, red and blue respectively, which is not listed in the present disclosure.

In this embodiment, the first sub-pixels 11 in the first row of two adjacent first pixel repetition units 12 are arranged in a color order of RGBRGB, and the second row is GBRGBR. The second sub-pixels 21 in the first row of the second pixel repetition units 22 are arranged in a color order of RGBRGB, and the second row is GBRGBR. The third sub-pixels 31 in the first row of the third pixel repetition units 32 are arranged in a color order of RGBRGB, and the second row is GBRGBR. In an embodiment, the display panel further includes multiple data lines, which extend in the second direction and are arranged in the first direction, each data line is disposed corresponding to a column of the sub-pixels in the first direction and is electrically connected to the column of the sub-pixels. In this embodiment, for the whole display area, each two columns of the first pixel repetition units 12 or each column of the second pixel repetition units 22 or each column of the third pixel repetition units 32 corresponds to six data lines, which are respectively d1/d2/d3/d4/d5/d6. A color order of a column of sub-pixels corresponds to d1 is RGRG . . . RG, a color order of a column of sub-pixels corresponds to d2 is GBGB . . . GB, a color order of a column of sub-pixels corresponds to d3 is BRBR . . . BR, a color order of a column of sub-pixels corresponds to d4 is RGRG . . . RG, a color order of a column of sub-pixels corresponds to d5 is GBGB . . . GB and a color order of a column of sub-pixels corresponds to d6 is BRBR . . . BR.

In some embodiment, the color order for the arrangement of the sub-pixels of the first pixel repetition units, the second pixel repetition units and the third pixel repetition units includes, but is not limited to the above examples. In some embodiments, set the color order for the arrangement of the sub-pixels of the pixel repetition units, the color order for the arrangement of the sub-pixels of each row is RGBRGB . . . RGB, which is not specifically limited in the present disclosure.

In any one of the above embodiments, pixels are arranged in a manner of matching different pixel size, different pixel resolution and different sub-pixel color order in the periphery of the first non-display area and other display areas, so that no residual space exists. Meanwhile, the pixels of the display area A are arranged in the Real arrangement and the pixels of the display areas B and B1 are arranged in the SPR arrangement. On the basis of ensuring normal display of the screen, high resolution display is implemented in the second display area and the third display area. The size and arrangement of the pixels in different display area are optimized, the space is rationally used and the display quality is improved.

Figure 9:
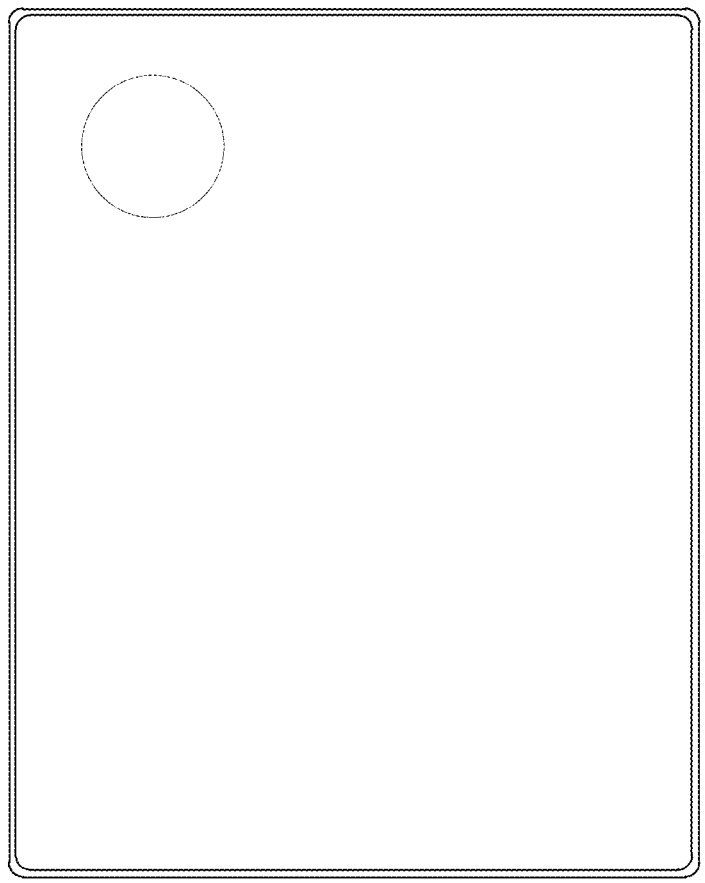
FIG. 9 is a schematic diagram of a display device according to an embodiment of the present disclosure.

An embodiment of the present disclosure further provides a display device. As shown in FIG. 9, the display device includes the display panel described in any one of embodiments of the present disclosure. In an embodiment, the display device is a rigid display device or a flexible display device. In an embodiment, the display device is an organic light-emitting display device. In one embodiment, the display device may be any electronic device having a display function, such as a smart phone, a laptop, a tablet, an EBook or a television.

What is claimed is:

1. A display panel, comprising:
   a first non-display area, a first display area, a second display area and a third display area, wherein the first display area at least partially surrounds the first non-display area, the first display area and the second display area are arranged in a first direction, the third display area is arranged with the first display area and the second display area in a second direction respectively, the first direction is perpendicular to the second direction;
   wherein the first display area comprises a plurality of first sub-pixels arranged in array, the second display area comprises a plurality of second sub-pixels arranged in array, the third display area comprises a plurality of third sub-pixels arranged in array; each first sub-pixel, each second sub-pixel and each third sub-pixel have a same size in the first direction; each first sub-pixel and each second sub-pixel have a same size in the second direction and each second sub-pixel has a size greater than each third sub-pixel in the second direction.

2. The display panel of claim 1, wherein the size of each third sub-pixel is ⅔ of the size of each second sub-pixel in the second direction.

3. The display panel of claim 1, wherein the first display area, the second display area and the third display area each comprises sub-pixels of at least three colors.

4. The display panel of claim 1, wherein the first display area comprises a plurality of first pixel repetition units arranged in array, each first pixel repetition unit comprises a number 3×2 of first sub-pixels;

the second display area comprises a plurality of second pixel repetition units arranged in array, each second pixel repetition unit comprises a number 6×2 of second sub-pixels; and the third display area comprises a plurality of third pixel repetition units arranged in array, each third pixel repetition unit comprises a number 6×2 of third sub-pixels.

5. The display panel of claim 4, wherein the first sub-pixels in a first row of each first pixel repetition unit are arranged in an order of a first color, a second color and a third color; the first sub-pixels in a second row of each first pixel repetition unit are arranged in an order of the third color, the second color and the first color;

the second sub-pixels in a first row of each second pixel repetition unit are arranged in an order of the first color, the second color, the third color, the first color, the second color and the third color; the second sub-pixels in a second row of each second pixel repetition unit are arranged in an order of the third color, the second color, the first color, the third color, the second color and the first color;

the third sub-pixels in a first row of each third pixel repetition unit are arranged in the order of the first color, the second color, the third color, the first color, the second color and the third color; the third sub-pixels in a second row of each third pixel repetition units are arranged in the order of the third color, the second color, the first color, the third color, the second color and the first color;

wherein the first color, the second color and the third color are different.

6. The display panel of claim 5, wherein the first color is one color of red, green and blue, the second color is one color of red, green and blue, the third color is one color of red, green and blue.

7. The display panel of claim 6, wherein the first color, the second color and the third color are red, green and blue respectively.

8. The display panel of claim 4, wherein the first sub-pixels in a first row of each first pixel repetition unit are arranged in an order of a first color, a second color and a third color; the first sub-pixels in a second row of each first pixel repetition unit are arranged in an order of the third color, the first color and the second color;

the second sub-pixels in a first row of each second pixel repetition unit are arranged in an order of the first color, the second color, the third color, the first color, the second color and the third color; the second sub-pixels in a second row of each second pixel repetition unit are arranged in an order of the third color, the first color, the second color, the third color, the first color and the second color;

the third sub-pixels in a first row of each third pixel repetition unit are arranged in the order of the first color, the second color, the third color, the first color, the second color and the third color; the third sub-pixels in a second row of each third pixel repetition unit are arranged in the order of the third color, the first color, the second color, the third color, the first color and the second color;

wherein the first color, the second color and the third color are different.

9. The display panel of claim 8, wherein the first color is one color of red, green and blue, the second color is one color of red, green and blue, the third color is one color of red, green and blue.

10. The display panel of claim 4, wherein the first sub-pixels in a first row of each first pixel repetition unit are arranged in an order of a first color, a second color and a third color; the first sub-pixels in a second row of each first pixel repetition unit are arranged in an order of the second color, the third color, and the first color;

the second sub-pixels in a first row of each second pixel repetition unit are arranged in an order of the first color, the second color, the third color, the first color, the second color and the third color; the second sub-pixels in a second row of each second pixel repetition unit are arranged in an order of the second color, the third color, the first color, the second color, the third color and the first color;

the third sub-pixels in a first row of each third pixel repetition unit are arranged in the order of the first color, the second color, the third color, the first color, the second color and the third color; the third sub-pixels in a second row of each third pixel repetition unit are arranged in the order of the second color, the third color, the first color, the second color, the third color and the first color;

wherein the first color, the second color and the third color are different.

11. The display panel of claim 10, wherein the first color is one color of red, green and blue, the second color is one color of red, green and blue, the third color is one color of red, green and blue.

12. The display panel of claim 1, wherein in the second direction, the first display area comprises an even number of rows of the first sub-pixels, the second display area comprises an even number of rows of the second sub-pixels, and the third display area comprises an even number of rows of the third sub-pixels;

in the first direction, a number of columns of the first sub-pixels in the first display area, a number of the second sub-pixels in the second display area and a number of the third sub-pixels in the third display area each is a multiple of 6.

13. The display panel of claim 1, wherein the second display area is disposed on two opposite sides of the first display area, the third display area is disposed on two opposite sides opposite of the first display area and the second display area.

14. The display panel of claim 1, further comprising a plurality of data lines, wherein the plurality of data lines extend in the second direction and are arranged in the first direction, each data line is disposed corresponding to a column of the sub-pixels in the first direction and is electrically connected to the column of the sub-pixels.

15. A display device, comprising a:

display panel, wherein the display panel comprises:

a first non-display area, a first display area, a second display area and a third display area, wherein the first display area at least partially surrounds the first non-display area, the first display area and the second display area are arranged in a first direction, the third display area is arranged with the first display area and the second display area in a second direction respectively, the first direction is perpendicular to the second direction;

wherein the first display area comprises a plurality of first sub-pixels arranged in array, the second display area comprises a plurality of second sub-pixels arranged in array, the third display area comprises a plurality of third sub-pixels arranged in array; each first sub-pixel, each second sub-pixel and each third sub-pixel have a same size in the first direction; each first sub-pixel and each second sub-pixel have a same size in the second direction and each second sub-pixel has a size greater than each third sub-pixel in the second direction.

* * * * *